United States Patent [19]

Oosawa et al.

[11] Patent Number: 5,435,683
[45] Date of Patent: * Jul. 25, 1995

[54] LOAD-LOCK UNIT AND WAFER TRANSFER SYSTEM

[75] Inventors: Tetsu Oosawa, Sagamihara; Teruo Asakawa, Yamanashi; Kenji Nebuka, Nirasaki; Hiroo Ono, Yamanashi, all of Japan

[73] Assignee: Tokyo Electron Limited, Tokyo, Japan

[*] Notice: The portion of the term of this patent subsequent to Aug. 23, 2011 has been disclaimed.

[21] Appl. No.: 294,761

[22] Filed: Aug. 23, 1994

Related U.S. Application Data

[63] Continuation of Ser. No. 857,832, Mar. 26, 1992, Pat. No. 5,340,261.

[30] Foreign Application Priority Data

Mar. 26, 1991 [JP] Japan .................................. 3-87527

[51] Int. Cl.6 ................................................ B65G 1/06
[52] U.S. Cl. .................................. 414/217; 414/936; 414/939; 414/754; 364/559; 118/719
[58] Field of Search .............. 414/939, 936, 937, 935, 414/938, 941, 754, 757, 783, 416, 417, 217, 222, 225, 226; 901/47; 118/719, 729, 730; 204/298.25; 356/400, 375; 340/674, 540; 364/559, 468; 250/361, 548

[56] References Cited

U.S. PATENT DOCUMENTS

| | | | |
|---|---|---|---|
| 4,457,664 | 7/1984 | Judell et al. | 414/779 |
| 4,457,664 | 7/1984 | Judell et al. | 414/937 X |
| 4,752,898 | 6/1988 | Koenig | 364/559 |
| 4,769,523 | 9/1988 | Tanimoto et al. | 219/121.6 |
| 4,836,733 | 6/1989 | Hertel et al. | 414/225 |
| 4,880,348 | 11/1989 | Baker et al. | 414/783 |
| 4,917,556 | 4/1990 | Stark et al. | 414/217 |
| 4,973,217 | 11/1990 | Engelbrecht | 414/754 |
| 5,054,991 | 10/1991 | Kato | 414/783 |
| 5,102,280 | 4/1992 | Poduje | 414/225 |
| 5,340,261 | 8/1994 | Oosawa et al. | 414/754 X |

FOREIGN PATENT DOCUMENTS

| | | | |
|---|---|---|---|
| 242066 | 10/1987 | European Pat. Off. | |
| 288233 | 10/1988 | European Pat. Off. | |
| 313466 | 4/1989 | European Pat. Off. | |
| 187644 | 8/1988 | Japan | 414/754 |
| 108740 | 4/1989 | Japan | 414/936 |
| 205049 | 8/1990 | Japan | 414/936 |

*Primary Examiner*—Frank E. Werner
*Attorney, Agent, or Firm*—Oblon, Spivak, McClelland, Maier, & Neustadt

[57] ABSTRACT

A load-lock unit is disposed between first and second atmospheres, for storing a wafer transferred from the first atmosphere, and which is blocked off from the first atmosphere, thereafter being set in an atmosphere at least substantially similar to the second atmosphere, and opened so as to communicate with the second atmosphere in order to transfer the wafer to the second atmosphere. The load-lock unit includes a load-lock chamber, a holding mechanism, disposed in the load-lock chamber for holding the wafer, a rotating mechanism for rotating the wafer held by the holding mechanism, and an error detecting mechanism for detecting a positional error of the center of the wafer and an orientation error of the wafer on the basis of data obtained by radiating light on the wafer which is rotating.

20 Claims, 7 Drawing Sheets

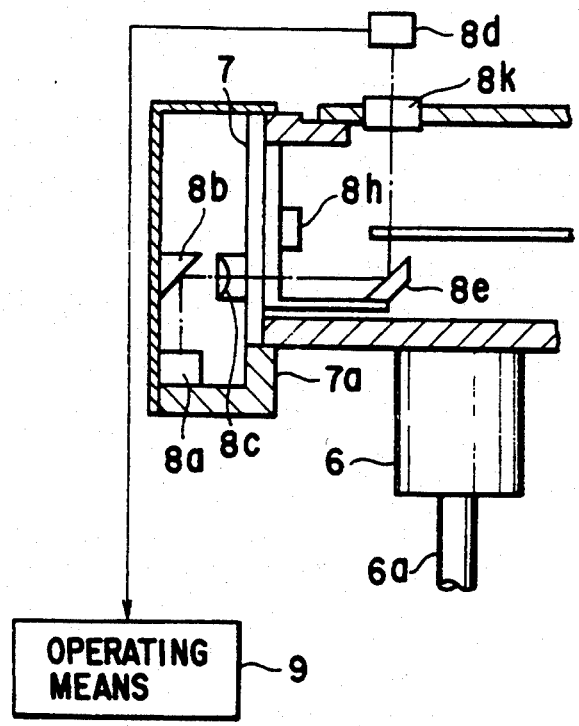
F I G. 7
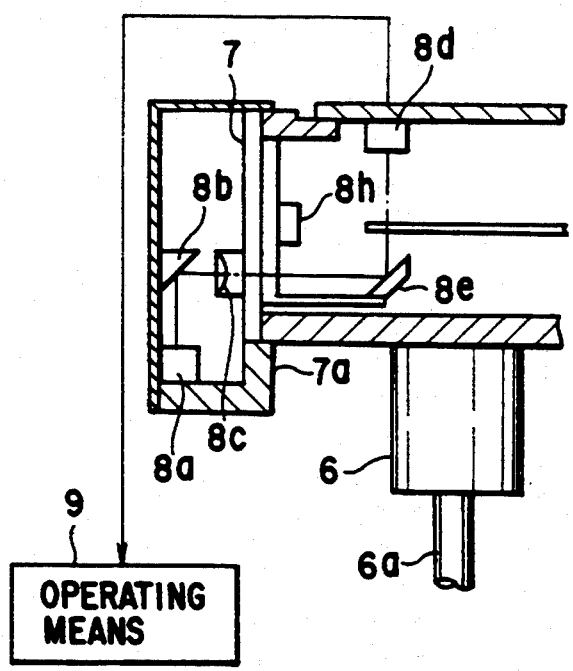
F I G. 8

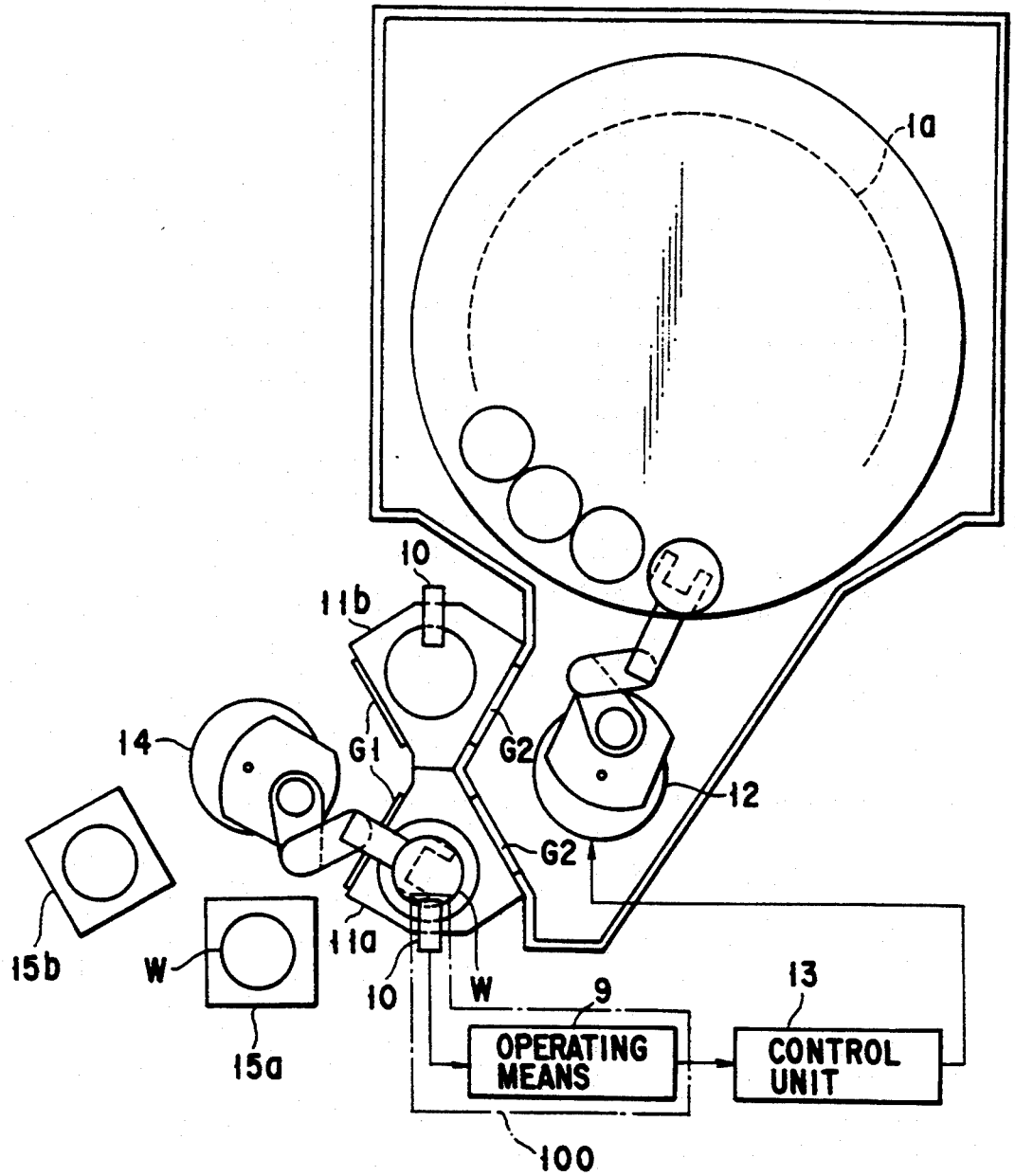
F I G. 9

LOAD-LOCK UNIT AND WAFER TRANSFER SYSTEM

This is a continuation of application Ser. No. 07/857,832, filed on Mar. 26, 1992, now U.S. Pat. No. 5,340,261.

BACKGROUND OF THE INVENTION

1. Field of the Invention

The present invention relates to a load-lock unit and, more particularly, to a load-lock unit for transferring a wafer between atmospheres having different pressures.

2. Description of the Related Art

When a semiconductor wafer is to be transferred between a process chamber for processing a semiconductor wafer in a vacuum atmosphere and the outside atmospheric pressure), a load-lock unit is used to improve the operation efficiency by shortening the time required for evacuation. With this load-lock unit, for example, to load the wafer in the process chamber from the outside, the wafer is first placed in a load-lock chamber, the interior of the load-lock chamber is evacuated to a predetermined pressure, the load-lock chamber is opened to communicate with the atmosphere in the process chamber, and then the wafer is loaded into the process chamber.

A semiconductor wafer has a crystal orientation. Thus, when a wafer is to be processed or tested, not only its central position but also its orientation or direction of arrangement sometimes needs to be aligned.

For example, in an ion implantation unit, as shown in FIG. 1, ions generated by an ion generator I disposed in a terminal unit T are deflected by an analyzing magnet M and sequentially implanted in a wafer W on a turntable 1a (upright during ion implantation) in a process chamber through an acceleration tube A. Each wafer must be placed on the turntable 1a from the outside to be correctly aligned.

For this purpose, conventionally, as shown in FIG. 2, wafers W are transferred one by one to an aligning unit OD from a carrier 3 disposed at a predetermined position outside the process chamber 1 by a transfer robot R1 on the outer air side. An orientation error and a positional error of the center of each wafer are detected by the aligning unit OD, and two correcting steps for correction of the orientation and central position are performed to correct the errors, thus positioning the wafer W. Then, the wafer W in the aligning unit OD is transferred to a load-lock unit 2 by the transfer robot R1. The load-lock unit 2 is evacuated, and the wafer W is transferred to the turntable 1a from the load-lock unit 2 by a transfer robot R2 on the process chamber 1 side.

In such a conventional method, however, when the wafers are transferred into the load-lock unit one by one from the carrier, they must pass through the aligning unit, resulting in an increase in number of wafer handling times. Thus, damage to the wafer tends to occur or particles of dust tend to attach the wafer, leading to a decrease in yield. At the same time, as the number of handling times is increased, the loading time is prolonged, decreasing the processing throughput of the load-lock unit.

Regarding the aligning unit, a servo mechanism for moving the wafer in X and Y directions is need to correct, e.g., the central position of the wafer. As a result, the aligning unit becomes complicated and costly and requires an additional installation space for the servo mechanism.

SUMMARY OF THE INVENTION

It is an object of the present invention to provide a compact load-lock unit which can increase the throughput and yield.

It is another object of the present invention to provide a wafer transfer system which can efficiently correct a positional error of a wafer.

According to the present invention, there is provided a load-lock unit which is disposed between first and second atmospheres, stores a wafer transferred from the first atmosphere, is blocked off from the first atmosphere, is thereafter set in the same atmosphere as or a similar atmosphere to the second atmosphere, and is opened to communicate with the second atmosphere in order to transfer the wafer to the second atmosphere, comprising a load-lock chamber, holding means, disposed in the load-lock chamber, for holding the wafer, rotating means for rotating the wafer held by the holding means, and error detecting means for detecting a positional error of the center of the wafer and an orientation error of the wafer on the basis of data obtained by radiating light on the wafer which is rotating.

According to the present invention, there is also provided a transfer system comprising a load-lock unit which is disposed between first and second atmospheres, stores a wafer transferred from the first atmosphere, is blocked off from the first atmosphere, is thereafter set in the same atmosphere as or a similar atmosphere to the second atmosphere, and is opened to communicate with the second atmosphere in order to transfer the wafer to the second atmosphere, transfer means for transferring the wafer in the load-lock unit to a predetermined position in the second atmosphere, and control means for controlling the transfer means, the load-lock unit comprising a load-lock chamber, holding means, disposed in the load-lock chamber, for holding the wafer, rotating means for rotating the wafer held by the holding means, and error detecting means for detecting a positional error of the center of the wafer and an orientation error of the wafer on the basis of data obtained by radiating light on the wafer which is rotating, and the control means controlling the transfer means so that the wafer is disposed at the predetermined position in the second atmosphere after the positional error of the center of the wafer and the orientation error of the wafer are corrected on the basis of data from the error detecting means.

Furthermore, according to the present invention, there is also provided a transfer system comprising a first load-lock unit which is disposed between first and second atmospheres, stores a wafer transferred from the first atmosphere, is blocked off from the first atmosphere, is thereafter set in the same atmosphere as or a similar atmosphere to the second atmosphere, and is opened to communicate with the second atmosphere in order to transfer the wafer to the second atmosphere, a second load-lock unit having the same arrangement as that of the first load-lock unit, transfer means for transferring the wafer in each of the first and second load-lock units to a predetermined position in the second atmosphere, and control means for controlling the transfer means, each of the first and second load-lock units comprising a load-lock chamber, holding means, disposed in the load-lock chamber, for holding the wafer, rotating means for rotating the wafer held by the holding means, and error detecting means for detecting a positional error of the center of the wafer and an orientation error of the wafer on the basis of data obtained by radiating light on the wafer which is rotating, and the control means controlling the transfer means so that the wafer is disposed at the predetermined position in the second atmosphere after the positional error of the center of the wafer and the orientation error of the wafer are corrected on the basis of data from the error detecting means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5 to 8 are sectional views showing various arrangements of a light-receiving section and a light-emitting section;

FIG. 9 is a view showing a wafer transfer system according to another embodiment of the present invention.

DETAILED DESCRIPTION OF THE PREFERRED EMBODIMENTS

The preferred embodiments of the present invention will be described with reference to the accompanying drawings.

Figure 1:
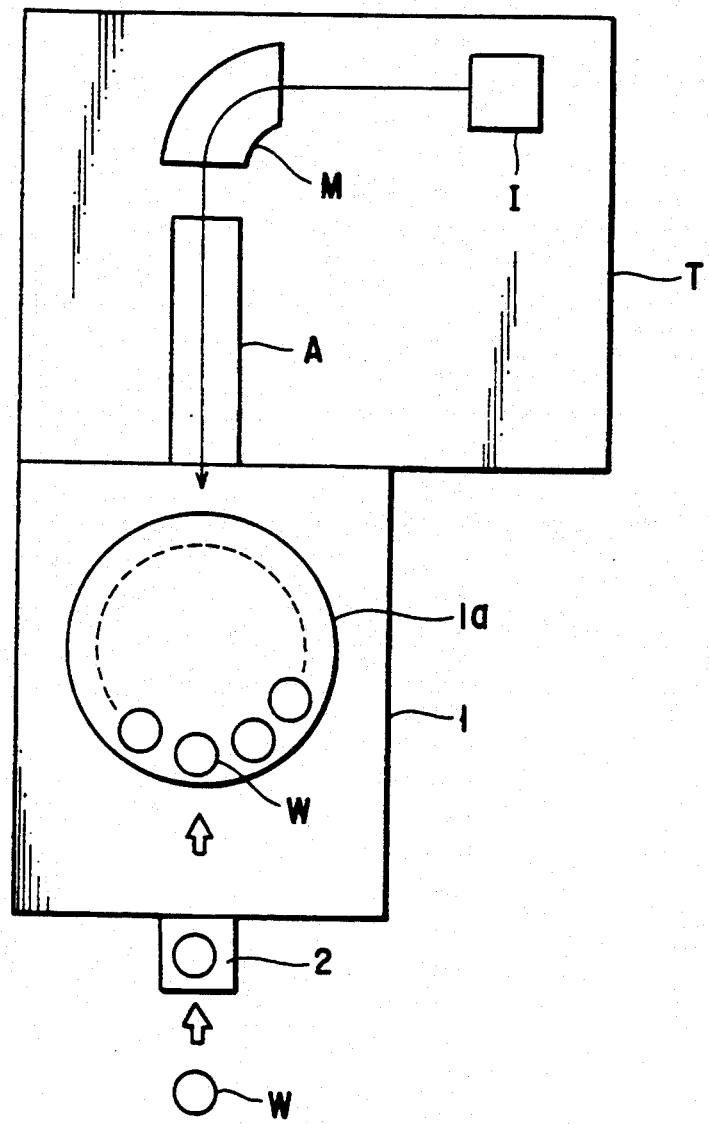
FIG. 1 is a view showing an overall arrangement of a conventional ion implantation unit.
Figure 2:
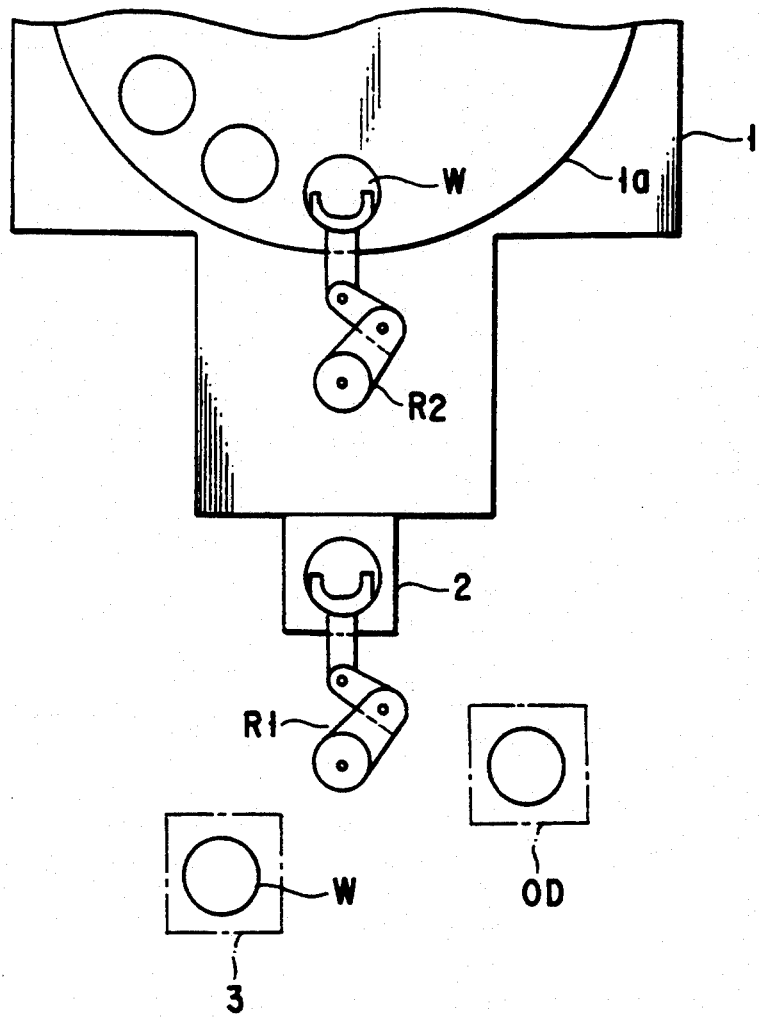
FIG. 2 is a view showing a conventional wafer transfer system of the ion implantation unit.
Figure 3:
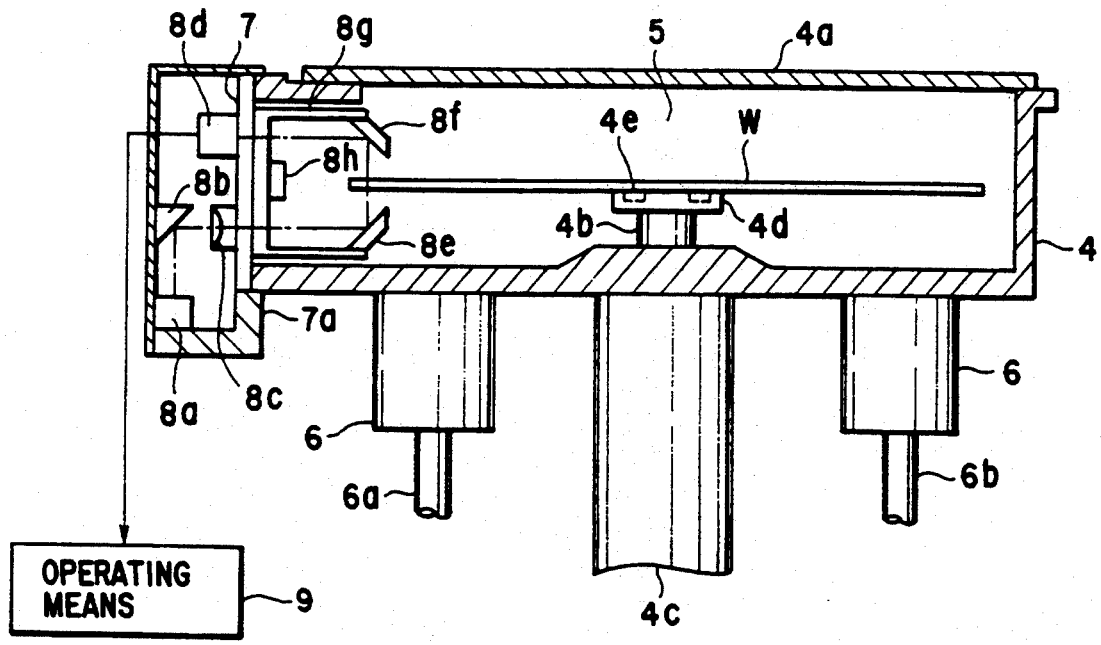
FIG. 3 is a longitudinal sectional view showing a load-lock unit according to an embodiment of the present invention.

FIG. 3 is a sectional view showing an arrangement of a load-lock unit according to an embodiment of the present invention. In this embodiment, a bottomed cylindrical member 4 which is open upward and a lid plate 4a constituted by, e.g., a glass plate for closing the open surface of the cylindrical member 4 constitute a load-lock chamber 5. A magnetic seal (not shown) is disposed in a cylindrical base portion 4c vertically extending downward from the central portion of the lower surface of the bottom portion of the cylindrical member 4. A rotating shaft 4b which rotates about a vertical axis is hermetically inserted in the load-lock chamber 5 at the central position of the bottom portion through the magnetic seal.

A motor (not shown) is coupled to the lower end of the rotating shaft 4b, and a turntable 4d is provided at the upper end of the rotating shaft 4b. A chuck unit comprising electrodes 4e for electrostatically chucking a wafer is disposed on the upper surface of the turntable 4d. In this arrangement, the chuck unit and the turntable 4d constitute a holding portion.

Air supply paths 6 each having an exhaust path for evacuating the load-lock chamber 5 are provided at, e.g., two portions under the cylindrical member 4. The air supply paths 6 have exhaust pipes 6a and 6b, respectively, for performing a two-step evacuation.

A window 7 constituted by a glass plate is mounted on part of a side surface of the cylindrical member 4, and a box member 7a is mounted on the cylindrical member 4 to cover the outer surface of the window 7. A light-emitting section 8a for emitting a laser beam is disposed on the bottom portion of the box member 7a. A mirror 8b, a cylindrical lens 8c, and a light-receiving section 8d are housed in the box member 7a. The mirror 8b reflects the laser beam, which has been emitted upward from the light-emitting section 8a, at a right angle toward the interior of the load-lock chamber 5. The lens 8c shapes the spot of the laser beam into a thin elongated shape. The light-receiving section 8d receives the laser beam returned from the load-lock chamber 5.

Figure 4:
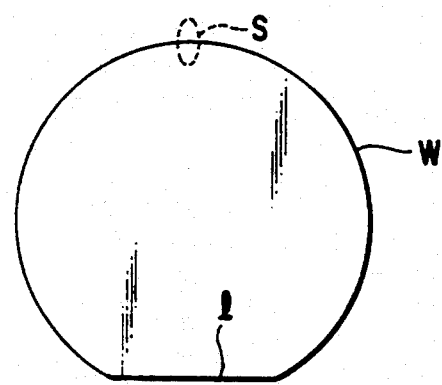
FIG. 4 is a view for explaining the positional relationship between a wafer and an optical path.

A mirror 8e which reflects at a right angle a laser beam incident through the window 7 in order to form an optical path perpendicular to the path of the wafer and a mirror 8f which reflects the laser beam reflected by the mirror 8e to the outside of the window 7 are arranged in the load-lock chamber 5. The positions of the pair of mirrors 8e and 8f are set at places where the center of the major axis of a slit section S of the laser beam is located on, e.g., the periphery (excluding a linear portion 1 called an orientation flat) of the wafer W, as shown in FIG. 4, when the center of the wafer coincides with the center of rotation of the rotating shaft 4b.

The light-emitting section 8a, the mirror 8b, the lens 8c, and the light-receiving section 8d constitute a first unit together with the window 7 and the box member 7a. The mirrors 8e and 8f in the load-lock chamber 5 are mounted on a U-shaped common holding member 8g so as to constitute a second unit and are fixed to the window 7 through a fixing member 8h.

If the respective members are combined to constitute the first and second units as described above, the relative positional relationship among the light-emitting section 8a, the mirror 8b, and the objective lens 8c and the position of the light-receiving section 8d of the first unit are preset, and the positions of the pair of mirrors 8e and 8f of the second unit are preset. Thus, to incorporate the first and second units in the load-lock unit, only the positions of the two units need be set. As a result, an optical path can be easily set with high precision in a small load-lock unit.

The light-receiving section 8d is connected to an operating means 9 for calculating a positional error amount of the wafer W in the load-lock chamber 5, i.e., the amount of error in central positioning and orientation (rotation angle) of the wafer W on the basis of an electrical signal corresponding to an amount of light received by the light-receiving section 8d. In FIG. 3, the light-emitting section 8a the light-receiving section 8d, and the operating means 9 constitute a positional error detecting means of the wafer. The load-lock unit according to this embodiment has the arrangement described above.

In the above-described embodiment shown in FIG. 3, the light-emitting and light-receiving sections 8a and 8d, are combined as the first unit and disposed in the box member 7a. However, they are not limited to this arrangement but can be disposed at various positions.

Figure 5:
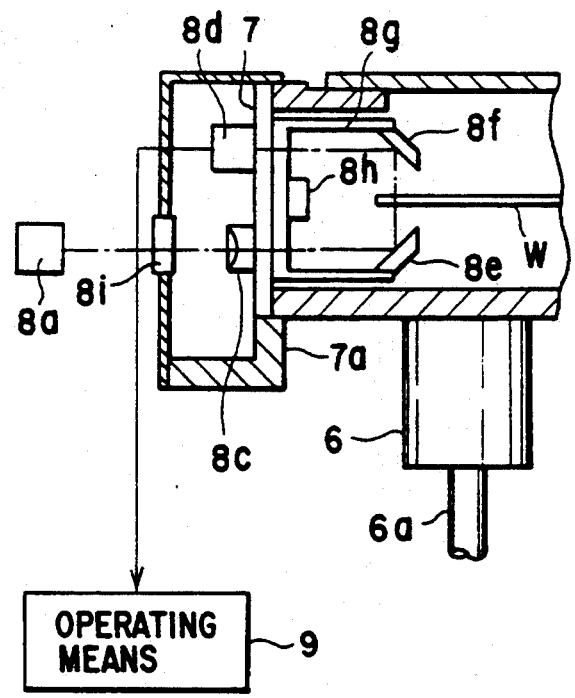

In the arrangement shown in FIG. 5, a light-emitting section 8a is disposed outside the box member 7a, and a laser beam emitted from the light-emitting section 8a is incident on a load-lock chamber 5 through a transparent plate 8i. The arrangement shown in FIG. 5 is advantageous in that a mirror 8b can be omitted.

Figure 6:
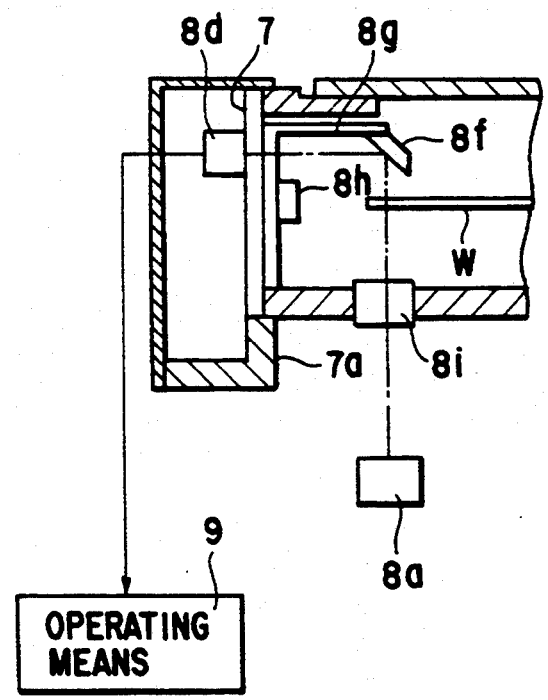

In the arrangement shown in FIG. 6, a light-emitting section 8a is disposed below a load-lock chamber 5, and a laser beam emitted from the light-emitting section 8a is incident on a load-lock chamber 5 through a transparent plate 8j. The arrangement shown in FIG. 6 is advantageous in that mirrors 8b and 8e can be omitted. Although not shown in FIG. 6, a lens 8c can be disposed either inside or outside the load-lock chamber 5.

In the arrangement shown in FIG. 7, a light-receiving section 8d, is arranged above a load-lock chamber 5, and a laser beam from the load-lock chamber 5 is incident on the light-receiving section 8d, through a transparent plate 8k. The arrangement shown in FIG. 7 is advantageous in that a mirror 8f can be omitted. In the arrangement shown in FIG. 7, the position of a light-emitting section 8a can be any one shown in FIG. 3, or 6. When the light-emitting section 8a is disposed at the position shown in FIG. 6, all the mirrors can be omitted.

In the arrangement shown in FIG. 8, a light-receiving section 8d, is disposed in a load-lock chamber 5. The arrangement shown in FIG. 8 is advantageous in that a mirror 8f can be omitted as in FIG. 7. In the arrangement shown in FIG. 8, the position of the light-emitting section 8a can be any one shown in FIG. 3, 5, or 6.

Operation of the load-lock unit described above will now be described with reference to FIG. 3.

A gate (not shown) of the load-lock chamber 5 on the outer air side is opened, and a non-processed wafer w disposed in an outer air is loaded in the load-lock chamber 5 by a transfer mechanism (not shown) through its intake port, placed on the turntable 4d, and fixed on the turntable 4d by the electrostatic chuck. The gate on the outer air side is closed and the load-lock chamber 5 is evacuated to a predetermined vacuum degree. A motor (not shown) is driven to rotate the wafer W once while the light-emitting section 8a emits a laser beam. If a starting point of data detection is near the vertex of the orientation flat, a peak corresponding to the vertex of the orientation flat appears at two ends of the detection data, thus sometimes causing inconvenience in data read access. Hence, the wafer W is normally rotated through about 360°+5°.

The amount of laser beam received by the light-receiving section 8d, corresponds to the position of the periphery of the wafer W in the laser beam range. Thus, the distance from the center of rotation to the periphery of the wafer W within the laser beam range at each angular position can be obtained by the operating means 9 on the basis of an electrical signal output from the light-receiving section 8d. The orientation flat 1 for determining the crystal orientation is formed in the wafer W. Therefore, an error amount of the center of the wafer W from a correct position and an error amount (error amount in rotation angle) of the orientation of the wafer W from a correct position can be simultaneously detected by obtaining the distance described above at each angular position of the wafer W.

The positional error of the center of the wafer need not be that from the correct position but can be a distance from a certain reference point, and the error in rotation angle can be an angle of the orientation flat with respect to a certain reference line.

Then, the electrostatic chuck is released, a gate (not shown) in the process chamber is opened, and the wafer W is loaded in the process chamber through its outlet port by the transfer mechanism (not shown).

The positional error of the center of the wafer and the error in rotation angle of the wafer can be detected in this manner in the load-lock unit. In this embodiment, e.g., an aligning mechanism (not shown) may be incorporated in the load-lock unit to correct these errors. Alternatively, alignment may be performed when the wafer is transferred into the process chamber from the load-lock unit as in another embodiment to be described below.

FIG. 9 shows pare of a transfer system for transferring a wafer to a turntable 1a in a process chamber 1 of an ion implantation unit from the outside (atmospheric pressure). In this system, first and second load-lock units 11a and 11b each having an optical path unit 10 including light-emitting and receiving sections and mirrors as shown in FIG. 3 are disposed adjacent to each other.

A transfer mechanism 12 comprising, e.g., an articulated robot is provided in the process chamber 1. A control unit 13 for controlling the transfer mechanism 12 on the basis of an operation result is connected to the output of an operating means 9 connected to the optical path unit 10. Reference numeral 14 denotes a transfer mechanism on the outer air side; and 15a and 15b, denote wafer carriers disposed at predetermined positions.

Operation of the system shown in FIG. 9 will now be described.

The non-processed wafers W buffered in the carrier 15a or 15b disposed in the outer air are loaded one by one in the first load-lock unit 11a at a lower portion in FIG. 9 by the transfer mechanism 14 through a gate G1 on the outer air side. When one wafer W is transferred, the gate G1 is closed, and the load-lock unit 11a is evacuated. The wafer W is rotated during or after evacuation, as described above, and the positional error of the wafer W is detected by the operating means 9 by a positional error detecting means 100, i.e., on the basis of an electrical signal from the optical path unit 10.

Subsequently, a gate G2 on the process chamber 1 side is opened and the wafer W in the load-lock unit 11a is transferred to a predetermined position on the turntable 1a by the transfer mechanism 12. At this time, the control unit 13 supplies a control signal to the transfer mechanism 12 so that the positional error of the center and the error in rotation angle of the wafer W occurring in the load-lock unit 11a are corrected on the basis of the operation result (positional error amount of the wafer) supplied from the operating means 9 when the wafer W is placed at the predetermined position on the turntable 1a.

Regarding control of the transfer mechanism 12, the positional error amount may be corrected when the transfer mechanism 12 is to receive the wafer W in the load-lock unit 11a or 11b or is to place the wafer W on the turntable 1a, or in a process after the transfer mechanism 12 receives the wafer W and before the transfer mechanism 12 is to place the wafer W.

Regarding correction of the positional error detected in the load-lock unit, the error in rotation angle of the wafer W may be corrected by the rotating shaft 4b in the load-lock unit, and only the positional error of the center of the wafer W may be corrected by the transfer mechanism 12.

Since the system shown in FIG. 9 has two load-lock units, while a wafer W is being loaded from one load-lock unit 11a or 11b in the process chamber 1, alignment (detection of a positional error) of the next wafer W can be performed on the other load-lock unit 11b or 11a. Thus, the waiting time normally required for alignment can be eliminated so as to increase the throughput.

Figure 10:
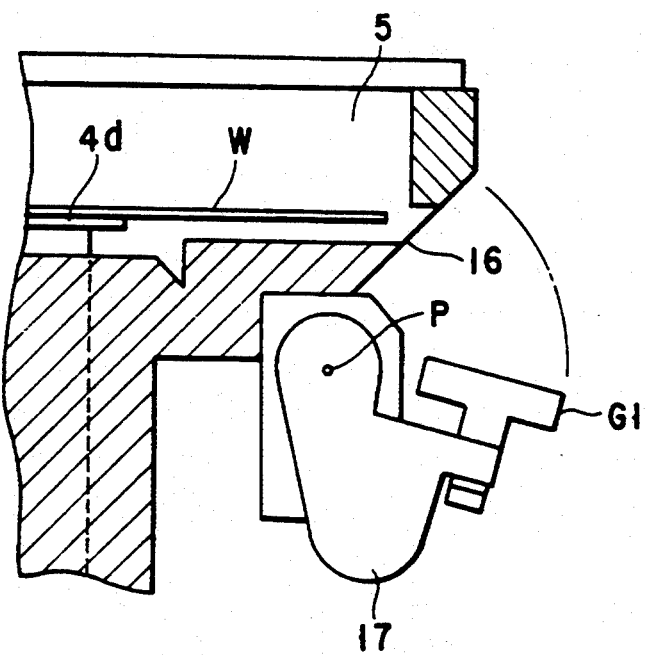
FIG. 10 is a sectional view showing a partial arrangement of the load-lock unit shown in FIG. 3.

Regarding the gate G1 of each of the load-lock units 11a and 11b, if the wafer inlet port is formed to have a surface 16 inclined at, e.g., 45° with respect to the vertical axis, and the gate G1 for opening and closing the inlet port is provided with a pivotal member 17 which pivots about a horizontal axis P, as shown in FIG. 10, the path of movement path of the gate G1 will not be widened in the transverse direction, and its movement distance can be minimized, thus minimizing the installation space. In this case, the gate G1 may be linearly moved in the vertical direction in place of being pivoted, or the arrangement described above may be applied to the gate G2 on the side of the process chamber.

Detection of the positional error of the wafer is not limited to the method described in this embodiment, and, e.g., light reflection by the periphery of the wafer may be utilized for this detection.

The present invention is not limited to wafer transfer between atmospheres having different pressures but can be similarly applied to wafer transfer between atmospheres having different types of gases.

As has been described above, according to the present invention, since the positional error of the wafer is detected in the load-lock unit, conventional handling including temporarily placing the wafer on the aligning unit can be eliminated. As a result, damage to the wafer and particles of dust attached to the wafer can be decreased, thus increasing the yield. In addition, since the time required for loading can be shortened, the throughput can be increased, and since the aligning unit can be eliminated, the size of the entire system can be reduced. Furthermore, since the positional error is detected on the basis of data obtained by rotation of the wafer, a large-size system such as a TV camera need not be used, thus avoiding an increase in size of the load-lock unit.

In particular, when the positional error of the wafer detected in the load-lock unit is corrected by the transfer mechanism disposed in the process chamber in, e.g., a vacuum atmosphere, transfer and correction of the positional error can be simultaneously performed, thus further increasing the throughput. In this manner, when the positional error is corrected at the final position of the wafer, e.g., at a position close to the turntable in the process chamber, high-precision alignment can be performed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A load-lock unit which is disposed between first and second atmospheres, for storing a wafer transferred from the first atmosphere, and which is blocked off from the first atmosphere, thereafter being set in an atmosphere at least substantially similar to the second atmosphere, and opened so as to communicate with the second atmosphere in order to transfer the wafer to the second atmosphere, said wafer having a shape bounded by at least a partially circular segment wherein said unit comprises:
   a load-lock chamber, having a wall and a floor;
   a holding mechanism, disposed in said load-lock chamber, for holding the wafer,
   a rotating mechanism for rotating the wafer held by said holding mechanism;
   an exhausting mechanism for evacuating the load-lock chamber; and
   an error detecting mechanism for detecting a positional error of a center of the wafer and an orientation error of the wafer while evacuating the load-lock chamber, based on data obtained by radiating light on the wafer when the wafer is rotating.

2. A unit according to claim 1, wherein said error detecting mechanism comprises an optical unit for generating an electrical signal on the basis of the optical data obtained by radiating light on the wafer which is rotating, and an operating mechanism, connected to said optical unit, for calculating the electrical signal.

3. A unit according to claim 2, wherein said optical unit comprises a light-emitting section for emitting a laser beam and a light-emitting section for receiving the laser beam emitted from the rotating wafer and converting the laser beam into an electrical signal.

4. A unit according to claim 2, wherein said light-receiving section receives the laser beam passing through a peripheral portion of the wafer and detects a light amount thereof.

5. A unit according to claim 2, wherein said light-receiving section receives the laser beam reflected by a peripheral portion of the wafer and detects a light amount thereof.

6. A unit according to claim 1, wherein said rotating mechanism rotates said holding mechanism.

7. A unit according to claim 1, wherein said load-lock chamber comprises a wafer inlet port having an open surface which is inclined obliquely downward, and a pivotal member which is pivotal about a horizontal axis for opening and closing the wafer inlet port.

8. A transfer system comprising a load-lock unit which is disposed between first and second atmospheres, for storing a wafer transferred from the first atmosphere, and which is blocked off from the first atmosphere, thereafter being set in an atmosphere at least substantially similar to the second atmosphere, and opened so as to communicate with the second atmosphere in order to transfer the wafer to the second atmosphere, said wafer having a shape bounded by at least a partially circular segment, a transfer mechanism for transferring the wafer in said load-lock unit to a predetermined position in the second atmosphere, and a control mechanism for controlling said transfer mechanism;
   said load-lock unit comprising a load-lock chamber having a wall and a floor, a holding mechanism, disposed in said load-lock chamber, for holding the wafer; a rotating mechanism for rotating the wafer held by said holding mechanism, an exhausting mechanism for evacuating the load-lock chamber; and an error detecting mechanism for detecting a positional error of a center of the wafer and an orientation error of the wafer while evacuating the load-lock chamber, based on data obtained by radiating light on the wafer when the wafer is rotating such that the rate of treatment of the wafer is improved; and said control mechanism controlling said transfer mechanism so that the wafer is disposed at the predetermined position in the second atmosphere after the positional error of the center thereof and the orientation error thereof are corrected on the basis of the data from said error detecting mechanism.

9. A system according to claim 8, wherein said transfer mechanism has a function of correcting the positional error of the center of the wafer and the orientation error of the wafer, and wherein the positional error of the center of the wafer and the orientation error of the wafer are corrected during transfer of the wafer by said transfer mechanism.

10. A system according to claim 8, wherein a mechanism for correcting the positional error of the center of the wafer and the orientation error of the wafer is arranged in said load-lock chamber, and wherein the positional error of the center of the wafer and the orientation error of the wafer are corrected in said load-lock chamber by said error correcting mechanism.

11. A system according to claim 8, wherein the orientation error of the wafer is corrected by rotation of the wafer by said rotating mechanism.

12. A system according to claim 8, wherein the orientation error of the wafer is corrected during evacuation of said load-lock chamber.

13. A system according to claim 8, wherein said error detecting mechanism comprises an optical unit for generating an electrical signal on the basis of the optical data obtained by radiating light on the wafer which is rotating, and an operating mechanism, connected to said optical unit, for calculating the electrical signal.

14. A system according to claim 13, wherein said optical unit comprises a light-emitting section for emitting a laser beam, and a light-receiving section for receiving the laser beam emitted from the rotating wafer and converting the laser beam into an electrical signal.

15. A system according to claim 13, wherein said light-receiving section receives the laser beam passing through a peripheral portion of the wafer and detects a light amount thereof.

16. A system according to claim 13, wherein said light-receiving section receives the laser beam reflected by a peripheral portion of the wafer and detects a light amount thereof.

17. A system according to claim 8, wherein said rotating mechanism rotates said holding mechanism.

18. A system according to claim 8, wherein said load-lock chamber comprises a wafer inlet port having an open surface which is inclined obliquely downward, and a pivotal member which is pivotal about a horizontal axis for opening and closing the wafer inlet port.

19. A transfer system comprising a first load-lock unit which is disposed between first and second atmospheres, for storing a wafer transferred from the first atmosphere, and which is blocked off from the first atmosphere, thereafter being set in an atmosphere at least substantially similar to the second atmosphere, and opened so as to communicate with the second atmosphere in order to transfer the wafer to the second atmosphere, said wafer having a shape bounded by at least a partially circular segment, a second load-lock unit having structure corresponding to that of said first load-lock unit, a transfer mechanism for transferring the wafer in each of said first and second load-lock units to a predetermined position in the second atmosphere, and a control mechanism for controlling said transfer mechanism;

each of said first and second load-lock units comprising a load-lock chamber having a wall and a floor, a holding mechanism, disposed in said load-lock chamber, for holding the wafer, a rotating mechanism for rotating the wafer held by said holding mechanism, an exhausting mechanism for evacuating the load-lock chamber, and an error detecting mechanism for detecting a positional error of a center of the wafer and an orientation error of the wafer while evacuating the load-lock chamber based on data obtained by radiating light on the wafer when the wafer is rotating such that the rate of treatment of the wafer is improved; and said control mechanism controlling said transfer mechanism so that the wafer is disposed at the predetermined position in the second atmosphere after the positional error of the center of the wafer and the orientation error of the wafer are corrected based on data from said error detecting mechanism.

20. A system according to claim 19, wherein the positional error of the center of the wafer and the orientation error of the wafer are detected in said second load-lock unit during transfer from said first load-lock unit to the second atmosphere.

* * * * *